United States Patent [19]
Nishida et al.

[11] Patent Number: 5,403,788
[45] Date of Patent: Apr. 4, 1995

[54] DIELECTRIC CERAMICS COMPOSITE MATERIAL

[75] Inventors: Masamitsu Nishida, Osaka; Koichi Kugimiya, Toyonaka, both of Japan

[73] Assignee: Matsushita Electric Industrial Co., Ltd., Japan

[21] Appl. No.: 231,989

[22] Filed: Apr. 21, 1994

Related U.S. Application Data

[63] Continuation of Ser. No. 965,220, Oct. 23, 1992, abandoned.

[30] Foreign Application Priority Data

Oct. 24, 1991 [JP] Japan ................................ 3-277413
Dec. 10, 1991 [JP] Japan ................................ 3-325566

[51] Int. Cl.$^6$ .................... C04B 35/49; C03C 14/00
[52] U.S. Cl. ........................ 501/32; 501/134; 501/135; 501/136; 501/137; 501/138; 501/139; 252/62.9
[58] Field of Search ............ 501/32, 134, 135, 136, 501/137, 138, 139; 252/62.9, 62.9 P

[56] References Cited

U.S. PATENT DOCUMENTS 4,710,479 12/1987 Yamanaka et al. .................. 501/32
5,073,523 12/1991 Yamada et al. ...................... 501/32
5,098,869 3/1992 Morimoto et al. .................... 501/32

FOREIGN PATENT DOCUMENTS 58-204579 11/1983 Japan .
61-031926 7/1986 Japan .
2-197181 8/1990 Japan .
2161647A 1/1986 United Kingdom .

*Primary Examiner*—Anthony Green
*Attorney, Agent, or Firm*—Ratner & Prestia

[57] ABSTRACT

A dielectric ceramic composite material comprising a dielectric ceramics and a glass having a softening temperature lower than the sintering temperature of the dielectric ceramics, wherein said particles of the dielectric ceramics are randomly dispersed in a matrix of the glass. This composite material can be formed by molding a mixture of the dielectric ceramics powder and glass powder at first, and by firing this mold (including a film thereof) at the softening temperature of the glass or higher. The obtained dielectric ceramics composite material can be extensively utilized as various ceramic functional elements or electronic components incorporated in various piezoelectric, pyroelectric, ferroelectric memory, actuator elements and many others.

10 Claims, 1 Drawing Sheet

DIELECTRIC CERAMICS COMPOSITE MATERIAL

This application is a continuation of application Ser. No. 07/965,220, filed Oct. 23, 1992, abandoned.

BACKGROUND OF THE INVENTION

1. Field of the Invention

The present invention relates to a ceramics composite material having dielectric properties. More particularly, the invention relates to a ferroelectric ceramics composite material which are piezoelectric elements that can be applied to electric filters, oscillators, actuators and the like, pyroelectric elements applied to infrared sensors and the like, and ferroelectric memory elements applied to non-volatile RAMs and the like. The invention also relates to an electrostrictive ceramics composite material useful as electronics components incorporated in positioning devices of precision instruments, actuators incorporated in video tape-recorders for auto-tracking, and the like.

2. Prior Art

Ferroelectric ceramics such as piezoelectric ceramics belong to the family of dielectric ceramics. They can comprise either a binary system ceramics such as $Pb(Ti, Zr)O_3$, a ternary system ceramics such as $Pb(Mg_{\frac{1}{3}}Nb_{\frac{2}{3}})_X Ti_Y Zr_Z O_3$, or a quadruple system ceramics such as $Pb(Zn_{\frac{1}{3}}Nb_{\frac{2}{3}})_A (Sn_{\frac{1}{3}}Nb_{\frac{2}{3}})_B Ti_C Zr_D O_3$ (where $X+Y+Z=1$ and $A+B+C+D=1$).

Almost all the elements which constitute these ceramics have ceramics compositions, which can be obtained by molding the raw ceramics materials or calcined powders thereof into a desired form, and then firing the mold at a high temperature. On the other hand, ferroelectric ceramics composites can be generated by mixing the powder of the above cited ceramics into an organic material such as rubber or epoxy resin, and these can be produced using a relatively low temperature manufacturing process.

Since the conventional ferroelectric ceramics have to be fired at a relatively high temperature ranging from 1100° to 1300° C., only refractory metals such as platinum can be employed as the internal electrodes of the ceramics elements such as a piezoelectric element and a pyroelectric element.

Moreover, since these ceramics can barely be formed into films, only a refractory metal such as platinum or heat-resistant ceramics can be used as the forming film. On the other hand, since the ferroelectric ceramics composites comprised of ferroelectric ceramics and organic material are definitely disadvantageous in terms of their low heat-resistance and low mechanical Q factors, these can hardly be used as the ceramics elements of oscillators or filters.

As for the electrostrictive ceramics which are a family of dielectric ceramics, the binary system ceramics such as $Pb(Mg_{\frac{1}{3}}Nb_{\frac{2}{3}})_X Ti_Y O_3$ (where $X+Y=1$), and ternary system ceramics such as $A[Pb(Ni_{\frac{1}{3}}Nb_{\frac{2}{3}})O_3]B[PbTiO_3]C[Ba(Zn_{\frac{1}{3}}Nb_{\frac{2}{3}})O_3]$ where $A+B+C=1$ are disclosed in Japanese Patent Publication No. 61-31926.

Almost all of the elements making up these ceramics are composed of ceramic, which can be obtained by molding the raw ceramics materials or calcined powders thereof into a desired form, and then firing the mold at a high temperature. Meanwhile, electrostrictive ceramics composites can be generated by mixing the powder of the above cited ceramics into an organic material such as rubber or epoxy resin, and can be produced using a relatively low temperature manufacturing process.

Since actuator elements utilizing the electrostrictive ceramics require no polarizing process afterward, and show no hysteresis in electric field vs. strain, less deterioration of characteristics by aging, and higher heat resistance over the one utilizing the conventional piezoelectric ceramics, the actuator elements made of these ceramics are now extensively employed in various actuators.

Since the firing temperature of conventional electrostrictive ceramics is relatively high, and it is within a range from 1100° to 1300° C., only refractory platinum can be employed as the internal electrodes in these actuator elements.

In addition to the above, these electrostrictive ceramics can barely be formed into films, and the forming substrate can comprise only refractory platinum or highly heat resistive ceramics. On the other hand, the electrostrictive ceramics composites comprised of electrostrictive ceramics and organic material are definitely disadvantageous because of their low heat resistance and low elastic constants and they can hardly withstand high amplitude mechanical stresses.

SUMMARY OF THE INVENTION

A new ceramics composite material having high heat resistance and excellent dielectric properties is produced using a relatively low temperature manufacturing process.

The ceramics composite material of the invention comprises a dielectric ceramics and a glass having a softening temperature lower than the sintering temperature of the dielectric ceramics. However, the dielectric ceramics mentioned in the present invention correspond to a ferroelectric ceramics and an electrostrictive ceramics.

The ferroelectric ceramics employed here can be a binary system ceramics such as $Pb(Ti, Zr)O_3$, a ternary system ceramics such as $Pb(Mg_{\frac{1}{3}}Nb_{\frac{2}{3}})_X Ti_Y Zr_Z_3$, (where $X+Y+Z=1$), a quadruple system ceramics such as $Pb(Zn_{\frac{1}{3}}Nb_{\frac{2}{3}})A(Sn_{\frac{1}{3}}Nb_{\frac{2}{3}})_B Ti_C Zr_D O_3$ (where $A+B+C+D=1$), or a ferroelectric ceramic composition such as $BaTiO_3$, $PbTiO_3$, $PbNb_2O_6$, $(Na, K) NbO_3$, etc.

The electrostrictive ceramics employed here can be a binary system ceramics such as $Pb(Mg_{\frac{1}{3}}Nb_{\frac{2}{3}})_X Ti_Y O_3$ (where $X+Y=1$), a ternary system ceramics such as $A[Pb(Ni_{\frac{1}{3}}Nb_{\frac{2}{3}})O_3] B[PbTiO_3]C[Ba(Zn_{\frac{1}{3}}Nb_{\frac{2}{3}})O_3]$ where $A+B+C=1$, or other electrostrictive ceramics composition. Furthermore, the glass employed here can be a glass of either $PbO.B_2O_3$, $PbO.B_2O_3.SiO_2$, $PbO.ZnO.B_2O_3$, $ZnO.B_2O_3.SiO_2$, or other system.

The ceramics composite material of the present invention can be prepared by mixing dielectric ceramics powder and glass powder having a softening temperature lower than the sintering temperature of the dielectric ceramics, and then firing the mixture of these two.

Since the powder mixture can be fired at a temperature close to the softening temperature of the glass powder (e.g., in a range from 300° to 800° C.), the ceramics composite material can be prepared at a temperature considerably lower than the sintering temperature of conventional ceramics comprised of purely dielectric ceramics, and this fact is advantageous with regard to the manufacture of various ceramic elements.

For instance, stainless steel or the like which is less heat resistant can be used as a substrate forming the ceramics composite materials of the invention.

Compared to the conventional ceramics composite materials which are prepared by mixing the powder of dielectric ceramics into an organic resin, the ceramics composite material of the invention is superior with respect to the heat resistance because no organic material which might be subject to thermal deterioration is included in the ceramics composite material of the invention.

Therefore, the ceramics composite material of the invention can be used extensively to construct various piezoelectric, pyroelectric, ferroelectric memory, and actuator elements. The relatively low firing temperature of the ceramics composite material of the invention is particularly advantageous for construction of ceramics elements by coating the ceramics composite on a substrate and by firing this afterward.

Moreover, since the ceramics composite material of the invention can be produced by using very fine dielectric ceramics powder and glass powder having very small average particle sizes, the elements can be made into a form of very thinfilm.

DETAILED DESCRIPTION OF THE INVENTION

Figure 1:
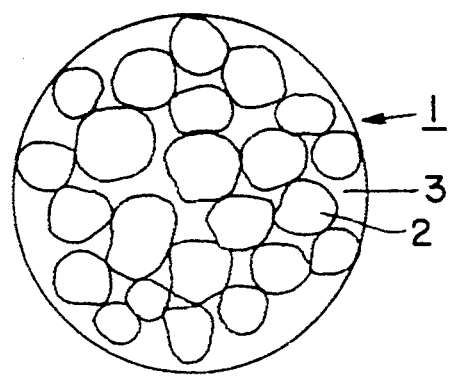
FIG. 1 is a schematic sectional view of the ceramics composite material of the invention comprising a dielectric ceramics and a glass.

A ferroelectric ceramics composite material consisting of a ferroelectric ceramics and a glass, which is one of the preferred modes of the invention, is now described below. As shown in FIG. 1, the ferroelectric ceramics composite material 1 consists of particles of ferroelectric ceramics 2 which are randomly dispersed into a matrix of glass 3.

The ceramics composite material 1 having the above-shown structure can be prepared by mixing powders of ferroelectric ceramics and glass having a softening temperature lower than the sintering temperature of said ceramics, and by firing the mixture at a temperature lower than the sintering temperature of the ceramics and equal to or higher than the softening temperature of the glass.

Since only the glass powder melts and no change in the ceramics particles is produced at that temperature range, the particles of ferroelectric ceramics 2 are evenly dispersed and fixed in the matrix of glass 3.

The average particle size of the ferroelectric ceramics 2 in this case is preferably 2 microns (micron meters) or smaller in order to attain a high packing density of the ceramics composite material 1. When the ceramics powder having an average particle size of 0.6 microns or smaller is employed, a ceramics composite material having an extremely high packing density of 98% or more of the theoretically attainable density can be obtained.

In contrast to the above, when ceramics powder having an average particle size of more than 2 microns is employed, ceramics composite material 1 having a lower packing density, or porous composite material, is produced. Satisfactory results are obtained when ferroelectric ceramics powder having an average particle size exceeding the critical particle size of the ferroelectricity is employed.

The volume proportion between the ferroelectric ceramics and the glass is determined arbitrarily depending on the desired ferroelectric characteristics. However, an excessively high volume of the ferroelectric ceramics may result in inadequate sintering because of the lower firing temperature. On the other hand, an excessively small volume of it may result in inadequate electrical characteristics. Therefore, the volume proportion of the ferroelectric ceramics in the ceramics composite material is preferably set within a range from 10 to 90%.

As for the ferroelectric ceramics 2 mentioned in the invention, any of the ferroelectric ceramics can be employed. More concretely, any of the binary system ceramics having a composition such as $Pb(Ti, Zr)O_3$, the ternary system ceramics composition such as $Pb(Mg_{\frac{1}{3}}Nb_{\frac{2}{3}})_X Ti_Y Zr_Z O_3$ (where $X+Y+Z=1$), the quadruple system ceramics composition such as $Pb(Zn_{\frac{1}{3}}Nb_{\frac{2}{3}})_A(Sn_{\frac{1}{3}}Nb_{\frac{2}{3}})_B Ti_C Zr_D O_3$ (where $A+B+C+D=1$), or the ferroelectric ceramics composites containing $BaTiO_3$, $PbTiO_3$, $PbNb_2O_6$, $(Na, K)NbO_3$, etc., can be employed.

As for the glass 3, any of the glass materials having a softening temperature lower than the sintering temperature of the ferroelectric ceramics can be employed. More concretely, the employment of any of the glasses such as $PbO.B_2O_3$, $PbO.B_2O_3.SiO_2$, $PbO.ZnO.B_2O_3$, $ZnO.B_2O_3.SiO_2$, or other system, is desirable.

Furthermore, the employment of a crystallized glass derived from the above-mentioned glass is highly desirable because of its possible higher heat resistance in the obtained ceramics composite material. The employment of a glass having a high chemical stability and a thermal expansion coefficient close to that of the ferroelectric ceramics is also highly desirable.

In the present invention an electrostrictive ceramics composite material can be derived by employing an electrostrictive ceramics instead of the above-described ferroelectric ceramics.

The electrostrictive ceramics mentioned here can be a binary system ceramics such as $Pb(Mg_{\frac{1}{3}}Nb_{\frac{2}{3}})_X Ti_Y O_3$ (where $X+Y=1$), a ternary system ceramics such as $A[Pb(Ni_{\frac{1}{3}}Nb_{\frac{2}{3}})O_3]$ $B[PbTiO_3]C[Ba(Zn_{\frac{1}{3}}Nb_{\frac{2}{3}})O_3]$ where $A+B+C=1$, or other electrostrictive ceramics compositions.

The desirable average particle size and the volume proportion of the electrostrictive ceramics in this case are identical with those of the case of ferroelectric ceramics composites. That is, the average particle size of the electrostrictive ceramics is preferably 2 microns or smaller and preferably 0.6 microns or smaller in order to achieve a dense packing density.

In contrast to the above, the lower limit of the average particle size is determined by the critical particle size of electrostriction. The desirable volume proportion in this case is within a range from 10 to 90% also.

Although the above explanation has been made for the ceramics composite material consisting of ferroelectric ceramics (or electrostrictive ceramics) and glass, the ceramics composite material of the invention can be obtained by using these ceramics and glass as the main materials, and other ceramics materials such as alumina, zirconia, titania, or others can be added thereto as long as these materials are compatible with the purpose of the invention.

A ceramics composite material comprised of the abovedescribed dielectric ceramics (ferroelectric ceramics or electrostrictive ceramics), glass and inorganic whiskers is now described below.

The object of the addition of inorganic whiskers is to improve the mechanical strength of the product such as the flexural strength, and an appropriate amount of the whiskers of magnesia, zirconia, SiC, $Si_3N_4$, ZnO, potassium titanate, barium titanate, strontium titanate, or other ceramics can be employed. In addition, the fiber of glass such as heat-resistive silica glass can be employed as the whiskers.

The size of the whiskers used is preferably within a range from 2 to 50 microns. Whiskers having a fiber length more than 50 microns may tend to lower the packing density, and ferroelectric or electrostrictive properties, and whiskers having a length of less than 2 microns may contribute very little to improve the flexural strength of the composite. Not withstanding the above, whiskers which have a length proportionally shorter to the average particle size of dielectric ceramics is recommendable.

Preferably, the amount of the whisker to be added is 15 volume % or less of the dielectric ceramics composite, otherwise, the ferroelectric or electrostrictive properties will be compromised.

Several examples of the invention are now given below.

Example 1

In preparing the first example of the invention, a ferroelectric calcined powder material of $Pb(Zn_{\frac{1}{3}}Nb_{\frac{2}{3}})_{0.09}(Sn_{\frac{1}{3}}Nb_{\frac{2}{3}})_{0.09}Ti_{0.42}Zr_{0.40}O_3$ ceramics was added to 0.5 wt % of $MnO_2$, which was prepared by mixing the raw powder materials, calcining the mixture at 1250° C. for two hours and pulverizing the mixture to form particles having an average size of about 4 microns by means of a ball-mill. This was mixed with $PbO.B_2O_3$ system powder, CF-8 glass having an average particle size of 3.8 microns, and a small amount of ceramics was included, which was manufactured by Nippon Electric Glass Co., Ltd., at a volume ratio shown in Table 1.

After ethanol which functions as a dispersive medium was added to the mixture of these powders, the mixture was pulverized to a powder having an average particle size of about 0.2 microns by using a media agitating mill (Motor Mill M50, manufactured by Eiger Engineering, Ltd., wherein zirconia balls having an average diameter of 0.4 mm were used and the mill was driven at a rim speed of 10 m/s. The mixture was then dried after treatment.

The product was then granulated using pure water, and the granules were sized using a 500 micron filter.

Then, granules so obtained were pressed into a die to form a disk having a diameter of 13 mm and a thickness of about 1 mm. The ferroelectric ceramics composite samples specified by Nos. 2 to 7 were obtained by firing the disk in an electric furnace at the firing temperature shown in Table 1 for two hours. The temperature increment and decrement rates employed were at 400° C. per hour in each case.

Figure 2:
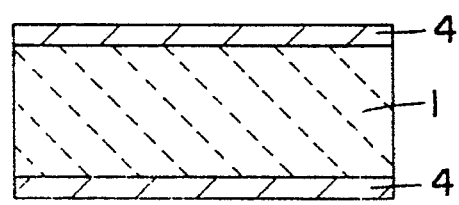
FIG. 2 is a schematic sectional view of the piezoelectric, pyroelectric, or ferroelectric element made of the invented ceramics composite material comprising a ferroelectric ceramics and a glass.

Then, Cr—Au double layered electrodes were deposited on both sides of the fired disk, and the piezoelectric elements having a structure shown in FIG. 2 were prepared by applying a DC electric field of 3 kV/mm thereon in a silicon oil bath kept at 100° C. for 30 minutes for polarization. FIG. 2, 1 shows a ferroelectric ceramics composite, and the number 4 denotes a pair of electrodes.

The dielectric constants, electromechanical coupling coefficients, and dielectric loss-tangents of these sample disks were determined, and the results of these tests are tabulated in Table 1. However, No. 1 and No. 8 sample samples are ceramics samples prepared for the purpose of comparison only, therefore data obtained on these samples should be viewed in that light.

TABLE 1

| No. | Mixing Ratio (in Vol. %) Ferro. powder | Mixing Ratio (in Vol. %) Glass powder | Firing Temp. (°C.) | Coupling coefficient Kp | Dielectric const. at 1 kHz | Dielectric loss-tang. at 1 kHz |
|---|---|---|---|---|---|---|
| 1 | 0 | 100 | 430 | 0 | 43 | 0.0087 |
| 2 | 10 | 90 | 400 | 0.05 | 75 | 0.0084 |
| 3 | 20 | 80 | 450 | 0.15 | 176 | 0.0049 |
| 4 | 40 | 60 | 450 | 0.19 | 210 | 0.0041 |
| 5 | 60 | 40 | 500 | 0.29 | 312 | 0.0048 |
| 6 | 80 | 20 | 500 | 0.31 | 329 | 0.0052 |
| 7 | 90 | 10 | 550 | 0.30 | 283 | 0.0083 |
| 8 | 100 | 0 | 1150 | 0.55 | 1260 | 0.0051 |

Wherein Ferro. means Ferroelectric ceramics.

As seen in Table 1, although the coupling coefficients and dielectric constants of the ferroelectric ceramics composite samples specified by Nos. 2 to 7 are slightly lower than those of the No. 8 comparison sample, these can be prepared at firing temperatures considerably lower than that for Sample No. 8. Moreover, if the No. 8 sample is fired at a temperature lower than 1000° C., it will not be sintered and therefore shows zero coupling coefficient, i.e., no piezoelectricity.

The average particle size of the ferroelectric ceramics particles in samples Nos. 2 to 7 as determined by microscopic observation is about 0.2 microns, and this is identical to that of the unfired samples.

An experiment similar to that described above was conducted in the cases where the average particle sizes of the ferroelectric ceramics powder pulverized by using the media agitating mill were different from those of afore-mentioned samples. In these cases the ferroelectric ceramics powder and the glass powder were mixed at a ratio which was the same as the one employed to prepare No. 5 sample. The densities of the fired samples comprising pulverized and mixed powder having average particle sizes of 1.9, 0.92, 0.58, 0.22 and 0.052 microns were 92, 94, 98, 98, and 98% of the respective theoretical densities.

Thus, densities of more than 90% of the theoretical densities were obtained when powders having average particle sizes of 2 microns or smaller were employed. Particularly when a powder having an average particle size of 0.6 microns or smaller was employed, a ceramics composite having an extremely high density of 98% was obtained.

In the embodiments described above, a method to prepare ceramics composites from the mixed powder of ferroelectric ceramics and glass which was pulverized together, was shown. However, identical results were obtained by mixing the powder of ferroelectric ceramics and the powder of glass which were independently pulverized.

When this particular manufacturing method was employed, the respective densities of the fired ceramics composites obtained by using powders having average particle sizes of 4.2, 1.8 and 0.45 microns were 69, 88, and 94% respectively compared with the theoretical densities. In this case, high density ceramics composites were also obtained when powder having an average particle size of 2 microns or smaller was employed.

The critical particle size exhibiting ferroelectricity was found to be approximately 0.02 microns in the cases of ferroelectric ceramics composites of the present example, so that the ferroelectric ceramics composites can be obtained when a ferroelectric ceramics powder having an average particle size of about 0.02 microns or more is employed.

The displacement of the piezoelectric elements in the direction of thickness was determined by using a differential transformer type displacement meter wherein a DC electric field of 2 kV/mm was applied between the electrodes of the polarized No. 5 specimen. A displacement of 0.38 microns in the thickness direction was observed demonstrating that the product was capable of functioning as a mechanical actuator.

Next, the terminal voltage generated between the electrodes when a temperature change was applied to the No 5 sample, was measured. Since this experiment confirmed that voltage could be generated which was proportional to the magnitude of the temperature change, a function for this product as a pyroelectric element within this structure was confirmed.

The D-E hysteresis loop of the No. 5 ceramics composite was also measured, and the results showed a coercive force $E_c$ of 2.3 kV/mm and a residual polarization $P_r$ of 14.6 $\mu C/cm^2$ demonstrating that the ceramics composite was capable of functioning as a ferroelectric memory element.

Example 2

In preparing Example 2 of the invention, a ferroelectric calcined powder material of $Pb(Zn_{\frac{1}{3}}Nb_{\frac{2}{3}})_{0.09}(Sn_{\frac{1}{3}}Nb_{\frac{2}{3}})_{0.09}Ti_{0.42}Zr_{0.40}O_3$ ceramics was added to 0.5 wt % of $MnO_2$. This was prepared by mixing the raw powder materials, calcining the mixture at 1250° C. for two hours and pulverizing itdown into particles having an average size of about 4 microns by means of a ball-mill. This was then mixed with the glass powder employed to prepare Example 1 at the ratios shown in Table 2.

After ethanol which functioned as a dispersive medium was added to the mixture of these powders, the mixture was pulverized down to a powder having an average particle size of about 0.2 microns by using a media agitating mill identical to that used in Example 1. The mixture was then dried.

Then, magnesia whiskers were added having an average diameter of about 2 microns and an average length of 24 microns as shown in Table 2. The mixture was made into granules by using pure water, and the granules were sized by passing through a 500 micron mesh filter. The granules were pressed into a die to form a disk having a diameter of 13 mm and a thickness of about 1 mm. The ferroelectric ceramics composite samples specified by Nos. 9 to 11 were obtained by firing the disks in an electric furnace at the firing temperature shown in Table 2 for two hours. The temperature increment and decrement rates employed in all cases were was at a rate of 400° C. per hour.

Then, Cr—Au electrodes were deposited on both sides of the fired disk, and the ferroelectric ceramic disks were prepared by applying a DC electric field of 3 kV/mm thereon in a silicon oil bath kept at 100° C. for 30 minutes for polarization.

The dielectric constants, electromechanical coupling coefficients, dielectric loss-tangents and flextural strengths of these sample disks were measured, and the results of these experiments are tabulated in Table 2. However, sample No. 9 is a ceramics sample containing no whiskers, and this is used for comparison only.

TABLE 2

| No | Mixing Ratio (in Vol. %) | | | Firing temp. (°C.) | Flextural strength (MPa) | Coupling coef. Kp | Dielectric const. at 1 kHz | Dielectric loss-tang at 1 kHz |
|---|---|---|---|---|---|---|---|---|
| | F | G | W | | | | | |
| 9 | 50 | 50 | 0 | 450 | 81 | 0.29 | 312 | 0.0045 |
| 10 | 50 | 45 | 5 | 450 | 95 | 0.30 | 305 | 0.0039 |
| 11 | 50 | 40 | 10 | 450 | 102 | 0.28 | 301 | 0.0042 |

F: powder of ferroelectric ceramics,
G: Glass powder,
W: magnesia whiskers.

As shown in Table 2, the flexural strengths of the ferroelectric ceramics composite samples containing whiskers specified by Sample Nos. 10 and 11 are higher than that which does not contain whiskers.

Example 3

Two sample Nos. 12 and 13 of the invention were prepared by using the materials employed to prepare the sample No. 3 in Example 1 and the sample No. 10 in Example 2, except that a crystallized glass (PbO.ZnO.$B_2O_3$ system glass LS-7105, having an average particle size of 7.5 microns and a softening temperature of 400° C., manufactured by Nippon Electric Glass Co., Ltd) was employed in this case. The ferroelectric ceramics composite samples were manufactured by the method employed in Examples 1 and 2.

The electrical characteristics such as the dielectric constants and the deformation temperature of these samples were measured, and the results of these are tabulated in Table 3 together with the results for sample Nos. 3 and 10. The deformation temperature is defined as the temperature at which the edge of the disk sample is rounded off after it is kept for a period of 5 hours.

TABLE 3

| No. | Type of glass | Firing temp. (°C.) | Coupl. coef. Kp | Dielectric constant at 1 kHz | Dielectric loss-tang at 1 kHz | Deformation temp (°C.) |
|---|---|---|---|---|---|---|
| 3 | Amorphous glass | 450 | 0.15 | 176 | 0.0049 | 560 |
| 12 | Crystallized glass | 450 | 0.16 | 201 | 0.0067 | 700 or higher |
| 10 | Amorphous glass | 450 | 0.30 | 305 | 0.0039 | 560 |
| 13 | Crystallized glass | 450 | 0.32 | 330 | 0.0051 | 700 or higher |

As shown in Table 3, the deformation temperature of the ferroelectric ceramics composites can be substantially increased by using a crystallized glass instead of amorphous glass. This results in a substantially higher heat resistance of the ferroelectric ceramics composite which can also withstand mechanical machining conducted at a high temperature or high temperature heat-treatment.

Example 4

In preparing Example 4 of the invention, a calcined powder of $0.5Pb(Ni_{\frac{1}{3}}Nb_{\frac{2}{3}})O_3 \cdot 0.4pbTiO_3 \cdot 0.1Ba(Zn_{\frac{1}{3}}Nb_{\frac{2}{3}})O_3$ electrostrictive ceramics was prepared by calcining a mixture of its raw materials at 1200° C. for two hours. This was pulverized into particles having an average size of about 3.2 microns by means of a ball-mill. Then, it was mixed with the glass powder employed to prepare samples of Example 1 at the ratios shown in Table 4.

After ethanol which functions as a dispersive medium was added to the mixture of these powders, the mixture was pulverized down to a powder having an average particle size of about 0.2 microns by using a media agitating mill identical to that used in Example 1. The mixture was then dried.

Then, the mixture was made into granules by using pure water, and the granules were sized by using a 500 micron mesh filter. The granules were then pressed into a die to form a rectangular plate having a length of 10 mm, a width of 5 mm and a thickness of about 1 mm. The samples of electrostrictive ceramics composite specified by Nos. 15 to 20 shown below were obtained by firing the plates in an electric furnace at the firing temperature shown in Table 4 for two hours. The temperature increment and decrement rates employed in all cases were at a rate of 400° C. per hour.

Then, Cr—Au double-layered electrodes were deposited on both sides of the fired disk, and the electrostrictive ceramic disks were prepared by applying a DC electric field of 2 kV/mm thereon for polarization.

The displacements along the lengthwise direction were measured by using a differential transformer type displacement meter, and the results are tabulated in Table 4 wherein the displacement in % is expressed by a displacement ratio against the sample length before the electric field is applied. Sample Nos. 14 and 21 are included for comparison only.

TABLE 4

| No. | Mixing Ratio (in Vol. %) Powder of ferro-electric ceramics | Powder of glass | Firing temp. (°C.) | Displacement (%) |
|---|---|---|---|---|
| 14 | 0 | 100 | 430 | 0.0 |
| 15 | 10 | 90 | 400 | 0.002 |
| 16 | 20 | 80 | 450 | 0.009 |
| 17 | 40 | 60 | 450 | 0.011 |
| 18 | 60 | 40 | 500 | 0.017 |
| 19 | 80 | 20 | 500 | 0.020 |
| 20 | 90 | 10 | 550 | 0.018 |
| 21 | 100 | 0 | 1120 | 0.035 |

As seen from Table 4, the displacements of the electrostrictive ceramics composite samples Nos. 15 to 20 are slightly lower than that of the contrast sample No. 21, but these can be fired at temperatures substantially lower than that of the contrast. Moreover, if the contrast sample No. 21 is fired at a temperature less than 1000° C., it is not sintered.

The average particle size of the electrostrictive ceramics particles in samples Nos. 15 to 20 determined by microscopic observation is about 0.2 microns, and this is identical with that of the unfired samples.

An experiment identical to the above was conducted for the cases where the average particle sizes of the electrostrictive ceramics powder which was pulverized by using the media agitating mill were different from those of the afore-mentioned samples. The electrostrictive ceramics powder and the glass powder were mixed at a ratio which was the same as the one employed to prepare No. 18 sample. The densities of the fired samples comprising the pulverized and mixed powder having average particle sizes of 2.4, 1.12, 0.56, 0.19 and 0.063 microns were 93, 94, 98, 99 and 98% of the respective theoretical densities.

Thus, densities of more than 90% of the theoretical densities are were obtained when powders having average particle sizes of 2.4 microns or smaller were employed. Particularly when a powder having an average particle size of 0.6 microns or smaller was employed, a ceramics composite having an extremely high density of 98% or more was obtained.

In Example 4, a method to prepare ceramics composites from a mixed powder of electrostrictive ceramics and glass which was pulverized together, were shown. However, the identical results were obtained by mixing the powder of electrostrictive ceramics and the powder of glass which were independently pulverized.

When this manufacturing method was employed, the respective densities of the fired ceramics composites obtained by using powders having average particle sizes of 3.2, 1.9 and 0.51 microns were 70, 89 and 93% respectively compared with the theoretical densities. In this case, high density ceramics composites were obtained also when powder having an average particle size of 2 microns or smaller was employed.

In the above-explained Example 4, the critical particle size showing electrostricity in the electrostrictive ceramics composites was found to be about 0.02 microns, so that an electrostrictive ceramics composite was obtained when electrostrictive ceramics particles having an average particle size of 0.02 microns or more were employed.

Example 5

In preparing Example 5 of the invention, a calcined powder of $0.5Pb(Ni_{\frac{1}{3}}Nb_{\frac{2}{3}})O_3 - 0.4PbTiO_3 - 0.1Ba(Zn_{\frac{1}{3}}Nb_{\frac{2}{3}})O_3$ electrostrictive ceramics was prepared by mixing its raw materials, calcining the mixture at 1200° C. for two hours and pulverizing into particles having an average size of about 3.2 microns by means of a ball-mill. This was mixed with the glass powder employed to prepare samples of Example 1 at the ratios shown in Table 5.

After ethanol which functions as a dispersive medium was added to the mixture of these powders, the mixture was pulverized down to a powder having an average particle size of about 0.2 microns by using a media agitating mill identical to that used in Example 1. The mixture was then dried.

Then, magnesia whiskers having an average diameter of about 2 microns and an average length of about 24 microns were added to the dried mixture, and the mixture was made into granules by using pure water, and the granules were sized by using a 500 micron mesh filter. The granules were then pressed into a die to form a rectangular plate having a length of 10 mm, a width of 5 mm and a thickness of about 1 mm. The samples of electrostrictive ceramics composite specified by Nos. 23 and 24 shown below were obtained by firing the plates in an electric furnace at the firing temperature shown in Table 5 for two hours. The temperature increment and decrement rates in all cases were at a rate of 400° C. per hour.

Then, Cr—Au double-layered electrodes were deposited on both sides of the fired disk, and the electrostrictive ceramic disks were prepared by applying a DC electric field of 2 kV/mm thereon for polarization.

The displacements along the lengthwise direction were measured by using the previously mentioned differential transformer type displacement meter and the flexural strengths were also measured. The results of these are tabulated in Table 5 wherein sample No. 22 is for comparison only and in which no whiskers are included.

TABLE 5

| No. | Mixing Ratio (in Vol. %) Powder of electrostrictive ceramics | Powder of glass | Magnesia whiskers | Firing temp. (°C.) | Flexural Strength (MPa) | Displacement (%) |
|---|---|---|---|---|---|---|
| 22 | 50 | 50 | 0 | 450 | 63 | 0.018 |
| 23 | 50 | 45 | 5 | 450 | 88 | 0.017 |
| 24 | 50 | 40 | 10 | 450 | 101 | 0.016 |

Table 5 shows that the fluxural strengths of Nos. 23 and 24 electrostrictive ceramics composite samples containing whiskers are considerably higher than that of the comparison sample No. 22 containing no whiskers.

Example 6

Two samples Nos. 25 and 26 of the invention were prepared by using the materials employed to prepare No. 16 sample in Example 4 and No. 23 sample in Example 5, except that a crystallized glass (PbO.ZnO.-$B_2O_3$ system glass LS-7105, having an average particle size of 7.5 microns and a softening temperature of 400° C., manufactured by Nippon Electric Glass Co., Ltd.) was employed in this case.

The electrostrictive ceramics composite samples were manufactured by the method substantially identical with the one employed in Example 4 and 5.

The displacements and the deformation temperatures of these samples were measured, and the results of these are shown in Table 6 together with the ones for samples Nos. 16 and 23. The deformation temperature is defined as the temperature at which the edge of disk sample is rounded off after it is kept for a period of 5 hours.

TABLE 6

| No. | Type of glass | Firing temp. (°C.) | Displacement (%) | Deformation temperature (°C.) |
|---|---|---|---|---|
| 16 | Amorphous glass | 450 | 0.009 | 560 |
| 25 | Crystallized glass | 450 | 0.010 | 700 or higher |
| 23 | Amorphous glass | 450 | 0.017 | 560 |
| 26 | Crystallized glass | 450 | 0.020 | 700 or higher |

As shown in Table 6, the deformation temperatures of electrostrictive ceramics composites comprised of crystallized glass are substantially higher than the samples comprising amorphous glass. This results in a substantially higher heat resistance of the electrostrictive ceramics composite which can also withstand mechanical machining conducted at a high temperature or high-temperature heat-treatment.

Example 7

In preparing Example 7 of the invention, a calcined powder of $0.5Pb(Ni_{\frac{1}{3}}Nb_{\frac{2}{3}})O_3$-$0.4PbTiO_3$-$0.1Ba(Zn_{\frac{1}{3}}Nb_{\frac{2}{3}})O_3$ electrostrictive ceramics was prepared by mixing its raw materials, calcining the mixture at 1200° C. for two hours and pulverizing into particles having an average size of about 3.2 microns by means of a ball-mill. This was mixed with the glass powder employed to prepare samples of Example 1 at a ratio employed to prepare No. 17 sample in Table 4.

After ethanol which functions as a dispersive medium was added to the mixture of these powders, the mixture was pulverized down to a powder having an average particle size of about 0.2 microns by using a media agitating mill same as the one used in Example 1. This slurry was dip-coated on the both sides of a stainless steel plate having a length of 20 mm, a width of 5 mm, and a thickness of 0.05 mm leaving a 5 mm-long space on the end of plate.

The coated electrostrictive ceramics composite layer was dried and fired at a temperature of 450° C. for two hours. Cr—Au double layered electrodes were deposited on both sides of the electrostrictive ceramic thin-film so obtained having an average thickness of 0.045 mm, saving 1 mm wide strip regions on the peripheral regions on both sides. And then, the electrostrictive element was mounted into an actuator element.

Figure 3:
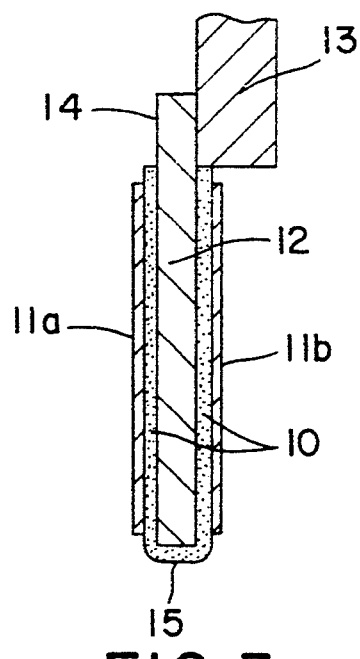
FIG. 3 is a schematic sectional view of the actuator element made of the invented ceramics composite material comprising an electrostrictive ceramics and a glass.

A schematic sectional view of the actuator element is shown in FIG. 3 wherein the numeral 10 is an electrostrictive ceramics composite film formed on the stainless steel plate 12. Numbers 11a and 11b are the Cr—Au electrodes formed on the electrostrictive ceramics composite film 10, and 13 is a mounting block on which an end 14 of the electrostrictive element is mounted. The electrostrictive element is mounted on the mounting block 13 by means of an epoxy-resin adhesive.

An application of DC potential between the electrode 11a or 11b and the stainless steel plate 12 will cause a displacement of the free-end 15 of the element in the right or left direction while the mounted end 14 is fixed.

The flexure displacement of the free-end 15 of the element produced by an application of 2 kV/mm electric field between the electrode 11a and the stainless steel plate, was measured by means of an optical microscope, and a leftward displacement of the free-end of 122 microns was confirmed. Likewise, a rightward displacement of 105 mm was observed when the same electric field was applied between the electrode 11b and the stainless steel plate 12.

We claim:

1. A ferroelectric ceramics composite material comprising: 10 to 90% by volume of a ferroelectric ceramics, selected from the group consisting of $PbTiO_3$, $PbZrO_3$, $Pb(Mg_{\frac{1}{3}}Nb_{\frac{2}{3}})_XTi_YZr_ZO_3$ (where $X+Y+Z=1$), $Pb(Zn_{\frac{1}{3}}Nb_{\frac{2}{3}})_A(Sn_{\frac{1}{3}}Nb_{\frac{2}{3}})_BTi_CZr_DO_3$ (where $A+B+C+D=1$), [$PbTiO_3$,] $BaTiO_3$, $PbNb_2O_6$, $NaNbO_3$, and $KNbO_3$, wherein the average particle size of said ferroelectric ceramics is 0.02 to 2.0 microns, 5 to 15% by volume of inorganic whiskers, and, the remainder being at least 10% by volume of a glass having a softening temperature that is in the range of from 300° C. to 800° C. and is lower than the sintering temperature of said ferroelectric ceramics, wherein particles of said ceramics are interspersed in a matrix of said glass.

2. A ferroelectric ceramics composite material according to claim 1, wherein the average particle size of said ferroelectric ceramics is 0.2 to 0.6 microns.

3. A ferroelectric ceramics composite material according to claim 1, wherein the average particle size of said ferroelectric ceramics is 0.02 to 0.6 microns.

4. The composite of claim 1 wherein said glass has a composition selected from $PbO.B_2O_3$, $PbO.B_2O_3.SiO_2$, $PbO.ZnO.B_2O_3$ and $ZnO.B_2O_3.SiO_2$.

5. The composite of claim 4 wherein said glass is a crystallized glass.

6. An electrostrictive ceramics composite material comprising: 10 to 90% by volume of an electrostrictive ceramics selected from the group consisting of $Pb(Mg_{\frac{1}{3}}Nb_{\frac{2}{3}})_xTi_yO_3$ (where $X+Y=1$) and $A[Pb(Ni_{\frac{1}{3}}Nb_{\frac{2}{3}})O_3]B[PbTiO_3]C[Ba(Zn_{\frac{1}{3}}Nb_{\frac{2}{3}})O_3]$ (where $A+B+C=1$), wherein the average particle size of said electrostrictive ceramics is 0.02 to 2.0 microns, 5 to 15% by volume of inorganic whiskers, and, the remainder being at least 10% by volume of a glass having a softening temperature that is in the range of from 300° C. to 800° C. and is lower than the sintering temperature of said electrostrictive ceramics, wherein particles of said ceramics are interspersed in a matrix of said glass.

7. An electrostrictive ceramics composite material according to claim 6, wherein the average particle size of said electrostrictive ceramics is 0.02 to 0.6 microns.

8. An electrostrictive composite material according to claim 6, wherein the average particle size of said electrostrictive ceramics is 0.02 to 0.6 microns.

9. The composite of claim 1 wherein said glass has a composition selected from $PbO.B_2O_3$, $PbO.B_2O_3.SiO_2$, $PbO.ZnO.B_2O_3$ and $ZnO.B_2O_3.SiO_2$.

10. The composite of claim 9 wherein said glass is a crystallized glass.

* * * * *